United States Patent [19]

Fogal et al.

[11] Patent Number: 5,140,404
[45] Date of Patent: Aug. 18, 1992

[54] SEMICONDUCTOR DEVICE MANUFACTURED BY A METHOD FOR ATTACHING A SEMICONDUCTOR DIE TO A LEADFRAME USING A THERMOPLASTIC COVERED CARRIER TAPE

[75] Inventors: Rich Fogal; Jerrold L. King; Walter L. Moden, all of Boise, Id.

[73] Assignee: Micron Technology, Inc., Boise, Id.

[21] Appl. No.: 688,023

[22] Filed: Apr. 19, 1991

Related U.S. Application Data

[62] Division of Ser. No. 602,990, Oct. 24, 1990.

[51] Int. Cl.⁵ .................. H01L 21/58; H01L 21/60
[52] U.S. Cl. .................. 357/70; 437/220; 357/80
[58] Field of Search ............. 437/206, 217, 220, 207; 357/70, 72, 80; 361/421

[56] References Cited

U.S. PATENT DOCUMENTS

| | | | |
|---|---|---|---|
| 3,691,289 | 9/1972 | Rohloff | 357/72 |
| 4,012,835 | 3/1977 | Wallick | 437/206 |
| 4,812,896 | 3/1989 | Rothgery et al. | 357/72 |
| 4,821,944 | 4/1989 | Tsumura | 228/4.5 |
| 4,882,298 | 11/1989 | Moeller et al. | 228/904 |
| 4,886,200 | 12/1989 | Tsumura | 228/4.5 |
| 4,924,291 | 5/1990 | Lesk et al. | 357/70 |
| 4,934,820 | 6/1990 | Takahashi et al. | 357/74 |
| 4,937,656 | 6/1990 | Kohara | 357/72 |
| 4,949,160 | 8/1990 | Ohno | 357/70 |
| 4,987,474 | 1/1991 | Yasuhara et al. | 357/72 |
| 4,989,068 | 1/1991 | Yasuhara et al. | 357/80 |
| 5,062,565 | 11/1991 | Wood et al. | 228/102 |

FOREIGN PATENT DOCUMENTS 59231825 12/1984 Japan.
02256251 10/1990 Japan.

*Primary Examiner*—Olik Chaudhuri
*Assistant Examiner*—David E. Graybill
*Attorney, Agent, or Firm*—Stanley N. Protigal

[57] ABSTRACT

The invention described is directed to a packaged semiconductor chip. As detailed, the invention requires a reduced number of steps to attach a die to a lead frame. The invention uses a carrier material layered on one or two sides with thermoplastic which can be softened to a desired state by the application of heat. By heating the thermoplastic and contacting the die and lead frame, the thermoplastic will bond the die and lead frame to the carrier material, thereby securing the die to the lead frame.

15 Claims, 3 Drawing Sheets

SEMICONDUCTOR DEVICE MANUFACTURED BY A METHOD FOR ATTACHING A SEMICONDUCTOR DIE TO A LEADFRAME USING A THERMOPLASTIC COVERED CARRIER TAPE

CROSS-REFERENCE TO RELATED APPLICATION

This is a divisional application of U.S. patent application Ser. No. 602,990 filed Oct, 24, 1990.

FIELD OF THE INVENTION

The present invention relates to the die attaching step required to assemble a semiconductor package in the semiconductor and microcircuit manufacturing industry. The invention described simplifies the conventional steps taken during the manufacturing process.

BACKGROUND OF THE INVENTION

The manufacture of semiconductors is one of the most competitive fields in industry today, due in part to the commodity nature of the business. To produce the most cost competitive product possible, throughput must be maximized. The higher quantity of chips a company can produce, the lower the per unit cost for the product. Speed and accuracy are often at odds, and finding the most profitable balance can be of utmost importance in maintaining a viable, cost-competitive product. As volumes of current generation chips produced by a typical manufacturing plant approach several million per month, slicing fractions of a second off per unit, manufacturing times can increase total throughput significantly. These high volumes also mean that a small percentage increase in product yield greatly increases the number of functioning units. In an ideal situation, two or more production steps can be accomplished in parallel.

One step of semiconductor manufacture that is not without problems is the die-leadframe attachment. During the manufacturing process, the die is attached to the leadframe, wires are connected from the bond pads on the die to the "fingers" on the leadframe, then the die is encapsulated in a protective plastic casing. The leadframe, part of which will eventually form the conductive leads of the component, contains an area to which the die is attached, called the "paddle." The die can be glued to the paddle, or attached with a tape. FIG. 1 shows a leadframe with a die wirebonded to it.

Below is a partial list of current methods of attaching the die to the leadframe:

1. Epoxy Paste—The epoxy is dispensed on the die paddle area of the leadframe. The die is placed on the uncured epoxy and held by a surface contact tool or an edge contact only tool (collet). The die is lowered into the epoxy by a surface contact tool or an edge contact only tool (collet). The die is pressed down into the epoxy by the tool and held in place long enough to ensure adhesion. X-Y movement (scrub) is sometimes used to increase adhesion and speed the process. This process requires a follow-on cure in a separate cure oven.

2. Epoxy Film—An epoxy film is dispensed on the die paddle of the leadframe and the die is lowered down to the film surface. Bonding is accomplished with pressure. This process requires a follow-on cure in a separate cure oven.

3. Epoxy Film on Tape—An epoxy film that is applied to both sides of a supporting tape is dispensed on the die paddle. Pressure is applied to the die to improve bonding, then the assembly is cured in a separate curing step.

4. Eutectic—A metal with a low melting temperature (solder) is dispensed onto the leadframe paddle. A die is placed on the dispensed metal. Adhesion is obtained by an intermixing of the die backside and the metal. Controlled pressure, scrub, and temperature are used. No follow-on cure is required.

5. Soft Solder—Same process as in Eutectic except that the metal does not mix with the backside material.

6. Glue—A conductive or non-conductive glue can be used as required. The glue would normally be quick set with no follow-on cure required.

Various problems are associated with the connection of the die to the die paddle, and with the connection of the wires from the die pad to the lead fingers. A few of the difficulties associated with the die and leadframe attachments are described below.

A. Corner crack—Occasionally a corner of the die will break, thereby making the semiconductor useless. This can result from an uneven coefficient of expansion between the die and the adhesive used to secure the die to the die paddle. After the die is attached to the leadframe, the assembly is heated at the wire bond step to attach the wire to the die pad. If the die and the glue expand at different rates, the corner of the die may crack. Corner crack can also occur from stress on the die due to shrinkage of the glue as it cures, although in recent years chemical improvements in glue has reduced this cause of corner crack.

B. Lead movement—Lead movement occurs after wire bonding. The lead fingers are relatively long for their thickness, and therefore can bend and move around quite easily. As the assembly is transported to location of the encapsulation step, the wire connections are often broken.

C. Die Shrink—One major objective of semiconductor manufacturing is to make the surface area of the die as small as possible in order to maximize the number of die per wafer. Meeting this objective results in a higher yield, more product for the same quantity of materials, and a lower price to customers. One problem resulting from shrinking the die is that a smaller leadframe must be produced to provide for a reliable length of bond wires. Wires that are over 0.100" long can create reliability problems, such as shorts to the silicon and between the bond wires.

The changeover to a new leadframe layout requires a redesign of the leadframe and purging of any extra leadframe stock. The changeover can incur great capital expense if the leadframe is stamped, and tooling costs can be high.

D. Paddle—The paddle of the leadframe itself is stamped to a lower plane during the manufacturing process, thereby positioning the bottom of the die below the fingers on the leadframe. See FIG. 2. The paddle downset allows for a thinner packaged semiconductor than if the die paddle is not downset, the reduction in package thickness being equal to the thickness of the leadframe. Having a paddle downset also creates problems, as a leadframe with a paddle downset is not as manufacturable as a leadframe without a paddle downset. The paddle downset requires specialized fixtures which are not necessary for leadframes without the downset.

The paddle itself also creates extra expense. The die paddle is typically gold or silver plated along with the conductive leads, in part because the paddle cannot economically be masked during plating of the conductive leads. The leads are plated to improve their conductive properties, but the plating of the paddle serves no functional purpose. This unnecessary plating of the paddle with gold or silver adds unnecessary cost to the product.

A method of attaching the die to the leadframe which solves many of the above problems is to replace the die paddle with a tape comprising a nonconductive plastic or polyimide carrier material with an adhesive on one or both sides. Several uses of the tape are possible. In one use, referred to as "chip on leadframe," an adhesive is applied to both sides of the tape which is sandwiched between the leadframe on the bottom and the die on the top, as shown in FIG. 4. Another use of the tape, "chip on tape," stacks the leadframe and the die on top of the tape, with each being adhered to the same side of the tape as shown in FIG. 5.

Using the tape, the chances of corner crack are reduced as the polyimide tape will give somewhat as the adhesive is curing. Lead movement is also prevented with the tape, as the tape holds the leads in place while the assembly is being transported to encapsulation. Also, the problems associated with the paddle downset are prevented as the tape does not require the leadframe to have a die paddle at all, as can be seen in FIG. 3. Finally, the tape allows the same leadframe design to be used in cases where the die is shrunk. Normally, the die paddle is manufactured about 20 mils larger than the size of the die in both length and width to allow for adhesive which might flow from between the die and the paddle during die attach. With the tape, there is no overflow and therefore the leadframe can be manufactured to a closer tolerance from the start. When the die shrinks, the original leadframe design can be used without die bond wires exceeding the 0.100" maximum length.

Despite its advantages, the polyimide tape as used to secure the die to the leadframe requires many steps to make it work. In the chip on leadframe implementation, adhesive is placed on one side of the tape, the tape is placed on the lead fingers, adhesive is spread on the other side of the tape, the die is placed on the tape, and the adhesive is allowed to cure. This requires more steps than die attachment using a die paddle, as with the die paddle implementation, adhesive is spread on the die paddle, the die is placed in the adhesive, and the adhesive is allowed to cure.

It is an intent of this invention to reduce the number of steps required in the die attach process in order to increase the overall quality and quantity of the product and to reduce time and cost of manufacture.

SUMMARY OF THE INVENTION

This invention reduces the number of steps required during the die attach step of semiconductor manufacture. The invention employs the use of a nonconductive plastic or polyimide carrier material supporting a layer of thermoplastic on one or both sides. If the thermoplastic is layered on only one side of the carrier, there must be other means for attaching the carrier to the leadframe, such as previously described, or used in the configuration of FIG. 5. Except where noted, it will be assumed that the thermoplastic, which will adhere the leadframe to one side of the carrier material and the die to the other side, is applied to both sides of the carrier. The thermoplastic, when heated, softens and flows to allow a die to be imbedded into the surface of the thermoplastic. the thermoplastic cools it hardens, thereby adhering the die to said carrier material. Possible steps in the die attach process using the invention are listed below:

1. A leadframe is positioned upon a die attach machine.

2. A precisely cut die-shaped section of carrier material, sandwiched between an upper and lower layer of thermoplastic, is placed centrally with respect to the leads on the leadframe as shown in FIG. 3 by a pick and place tool. The material, which can be round, oval, rectangular, or any shape which adequately serves the purpose of the invention, may also be applied directly by a punch mechanism over or under the frame. A thermode is used to produce a controlled temperature and pressure which softens and flows the thermoplastic, thereby adhering the material to the leadframe. This step, from a semiconductor manufacturer's standpoint, is most efficiently performed by the leadframe supplier.

3. The leadframe, with the material attached, is precisely and mechanically indexed to a second position or "window."

4. The semiconductor device is then picked out of the array of the die that constitutes a wafer. The semiconductor device is placed on the thermoplastic. The temperature and pressure at this position are similar to the previous position, again softening and flowing the thermoplastic.

5. The leadframe is then indexed to a third, bonding position, known as the post die attach lamination station. Here another thermode is employed to securely laminate all of the elements together, effectively creating a single, uniformly structured package.

Any of the above steps can be integrated into a single step, where possible.

Note that by careful selection and control of the temperature zones, the softness of the adhesive material can be accurately controlled. The material can be softened for attachment to the leadframe without adhering to the tool, softened further for die attach without causing the die to "float", and stiffened for wire bonding without slipping out of position.

DETAILED DESCRIPTION OF THE PREFERRED EMBODIMENT

Figure 1:
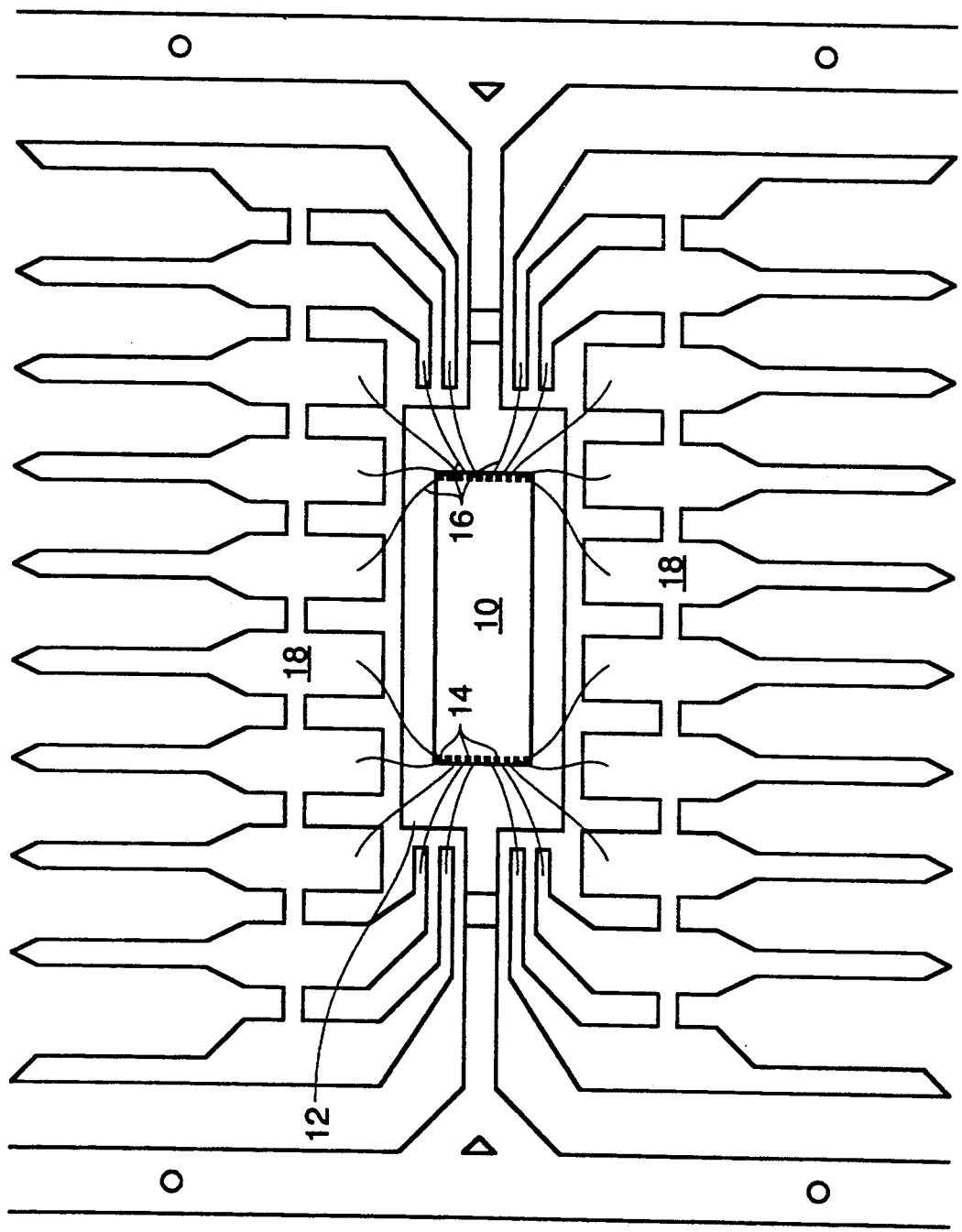
FIG. 1 shows a top view of a die in place on a die paddle of the leadframe and wirebonded to the conductive leads of the leadframe.
Figure 2:
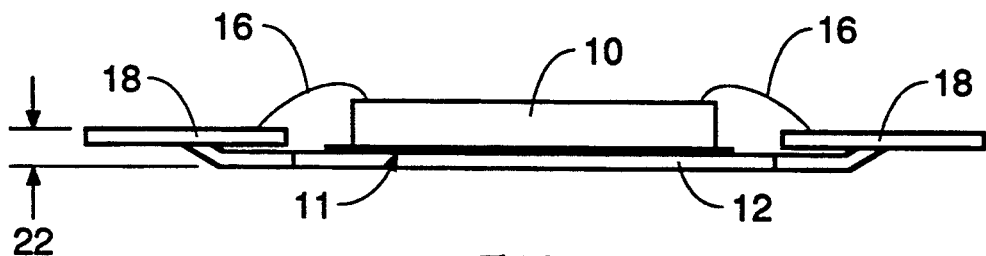
FIG. 2 is a side view of the assembly in FIG. 1 and shows the reduction in thickness which results from downsetting the paddle.

FIGS. 1 and 2 (prior art) show a widely used type of die-leadframe assembly. The semiconductor die 10 is attached to the die paddle of the leadframe 12 with an adhesive 11. Common adhesives used for attaching a die 10 to a paddle 12 are epoxy paste, epoxy film, metal, or glue. A gold bond wire 16 attaches the bond pads 14 to the conductive leads 18 of the leadframe. A downset 22 of the paddle 12 reduces the thickness of the package.

Figure 3:
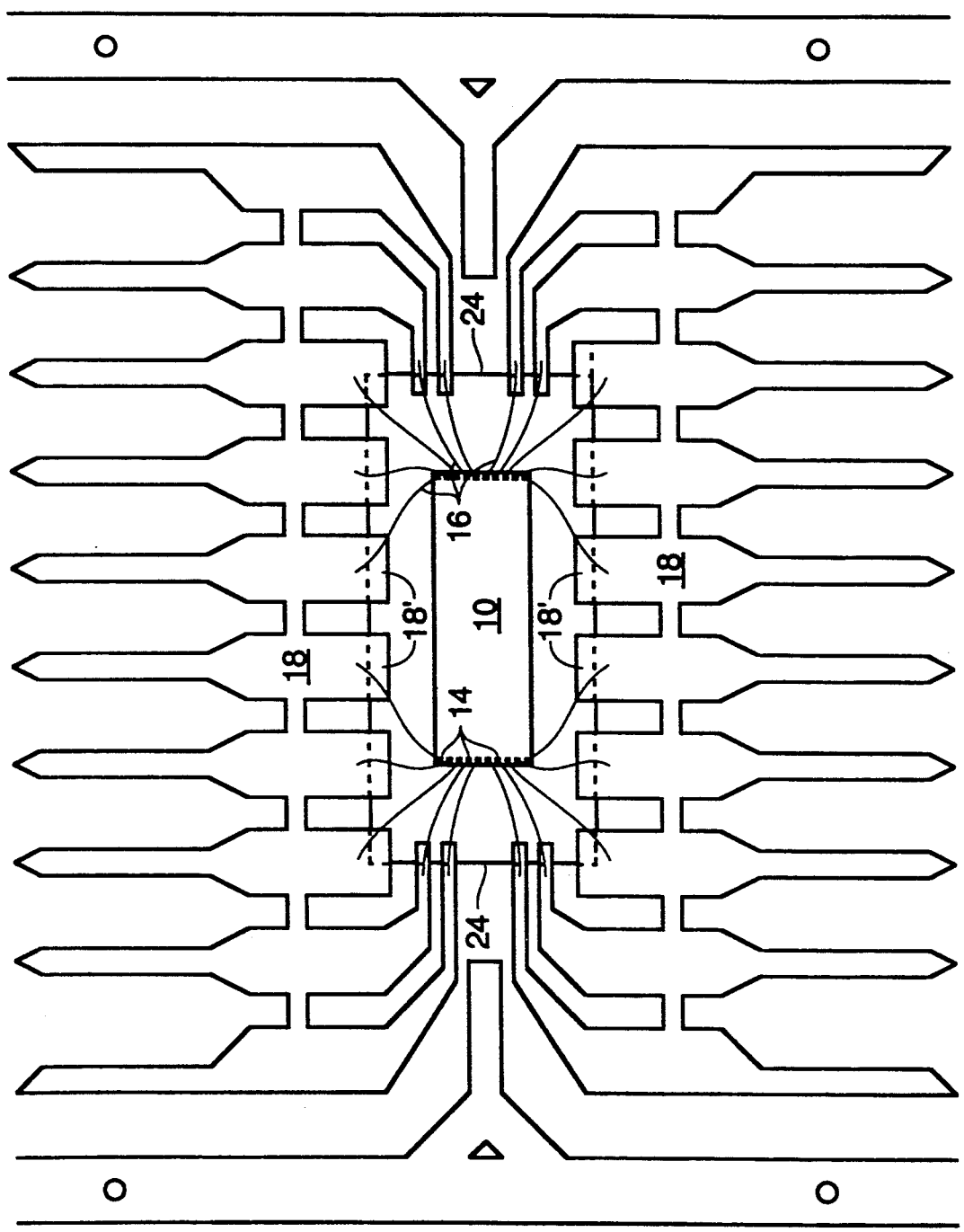
FIG. 3 shows a top view of a die attached by tape means to the leadframe in a chip on leadframe assembly. The die is wirebonded to the conductive leads of the leadframe.

FIG. 3 shows an assembly similar to that in FIG. 1, but with the die paddle (12 in FIG. 1) replaced with tape 24. The tape contacts the ends of the conductive leads 18', thereby holding them in place and preventing them from bending. The tape 24 is actually a plastic or polyimide carrier material with adhesive applied to either one or two sides, depending on the configuration. Tape of this sort is available from various sources, such as E.I. DuPont de Nemours where it is sold under the trade name "Kapton TM". This tape is supplied in thicknesses of about 0.5 mils to 3 mils. To use the tape 24 in its current form, adhesive must be applied by the semiconductor manufacturer immediately prior to use. The adhesive is applied to one side of the tape 24, the tape 24 is placed over the ends of the leads 18', the ends being proximal to the die 10, adhesive is applied to the other side of the tape 24, and the die 10 is applied to the tape 24. The tape 24 is then allowed to cure or, more commonly, cured in ovens.

The invention employs a plastic or polyimide carrier material, like that found in the tape assembly of FIG. 3, said carrier material layered on one or two sides with a thermoplastic instead of adhesive. The thermoplastic is applied to the carrier material in thicknesses of between about 0.10 mils to 0.18 mils. Said thermoplastic will soften and flow as it is heated above a temperature of about 98° C., and will soften to different viscosities at different temperatures. The ability to soften to a significantly different viscosity results in the thermoplastic having a soft state, in which the thermoplastic retains form, but that form is readily changed through plastic deformation without exerting excessive pressure on a semiconductor die. Such a thermoplastic is available from E.I. DuPont de Nemours under the name "QL3400 TM" resin. To use the carrier material layered on two sides with the thermoplastic, a semiconductor manufacturer will apply the carrier to the leadframe, heat the thermoplastic to its soft state, apply the die, and allow the thermoplastic to cool, thereby adhering the die to the carrier material. Alternately, the manufacturer would apply the carrier to the leadframe, place the die on the thermoplastic, heat the material and allow the material to cool, thereby adhering the die to the carrier material. An X-Y scrub of the die can be used to improve adhesion.

Ideally, this die attach process could be accomplished in-situ during the normal course of some other step, such as wire bond. During the usual wirebond procedure, the die is heated to a temperature greater than 100° C., which is warm enough to soften some thermoplastics. If the die is placed on the tape 24 prior to wirebonding, the thermoplastic could be heated to a temperature sufficient to soften the thermoplastic at the normal wirebonding step, thereby relieving the manufacturer of several steps usually required during the semiconductor manufacturing process when, for example, an epoxy is used to attach a die to a die paddle on the leadframe. Heating the thermoplastic in the normal course of the wire bond step would also reduce manufacturing time and increase product volume.

Another advantage of using said thermoplastic instead of an adhesive is that an adhesive such as epoxy must be applied immediately before attaching the die, and then heat cured. Said thermoplastic can be applied to the tape 24 at any time before the die step, even at another manufacturing facility such as by the leadframe supplier.

Figure 4:
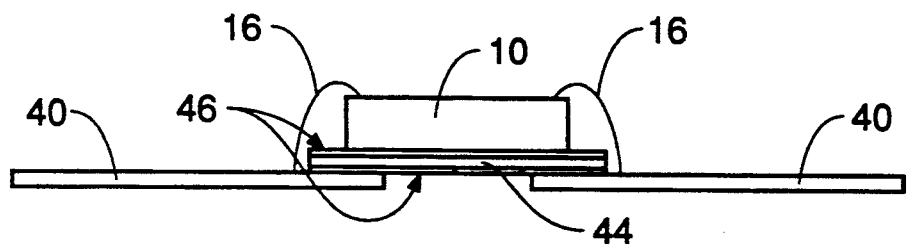
FIG. 4 shows a chip on leadframe assembly.

FIG. 4 shows one arrangement of leadframe 40, tape 44, and the die 10. In this configuration, the carrier material 44 has two layers of thermoplastic 46, one on each side. The carrier material 44 is attached to the leadframe 40 on the bottom, and the die 10 is attached to the carrier material 44. Bond wires 16 connect the bond pads (not shown) of the die to the leads (not shown) of the leadframe 40.

Figure 5:
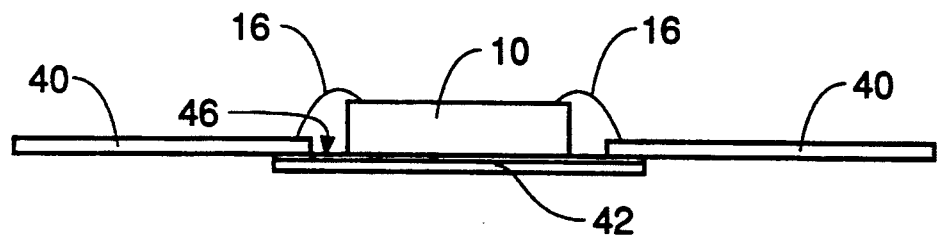
FIG. 5 shows a chip on tape assembly.

FIG. 5 shows a use of the carrier material 42 with a single layer of thermoplastic 46. The leadframe 40 and die 10 are attached to the top of the carrier material 42. Bond wires 16 connect the bond pads (not shown) of the die 10 to the leads (not shown) of the leadframe 40.

The invention has been fully described in a preferred embodiment but modifications and variations may become apparent to those skilled in the art, especially with respect to the assembly steps. However, the scope of the present invention is not limited by the above described details but only by the terms of the appended claims.

We claim:

1. A semiconductor integrated circuit device in which a semiconductor die is mounted to a lead frame having no die paddle, manufactured by the steps of:
    a) applying a thermoplastic to a first side of a carrier material, said thermoplastic having a physical property such that as it is heated to about 100° C. it softens and flows, and as it cools to its preheated temperature it returns to its preheated state;
    b) applying an adhesive to a second side of said carrier material;
    c) contacting said second side of said carrier material to leads of the lead frame;
    d) placing said semiconductor die on said first side of said carrier material;
    e) heating said thermoplastic to its soft state; and
    f) cooling said thermoplastic to its preheated state, thereby bonding said die and said leads to said carrier material, said carrier material supporting said die and said leads.

2. The semiconductor integrated circuit device of claim 1, wherein said application of said thermoplastic is performed before said application of said adhesive.

3. The semiconductor integrated circuit device of claim 1, wherein said heating step is performed before said placing step.

4. The semiconductor integrated circuit device of claim 1, wherein said thermoplastic heating step is performed during wire bond.

5. The semiconductor integrated circuit device of claim 1, wherein said carrier material is plastic.

6. The semiconductor integrated circuit device of claim 1, wherein said carrier material is polyimide.

7. A semiconductor integrated circuit device in which a semiconductor die is mounted to a lead frame having no die paddle, manufactured by the steps of:
    a) applying a thermoplastic to both a first and a second side of a carrier material, said thermoplastic having a physical property such that as it is heated to about 100° C. it softens and flows, and as it cools to its preheated temperature it returns to its preheated state;
    b) contacting said first side of said carrier material to leads of the lead frame;
    c) placing said semiconductor die on said second side of said carrier material;
    d) heating said thermoplastic to its soft state; and e) cooling said thermoplastic to its preheated state, thereby bonding said die and said leads of the lead frame to said carrier material, said carrier material supporting said die and said leads.

8. The semiconductor integrated circuit device of claim 7, wherein said contacting and placing steps are performed after said heating step.

9. The semiconductor integrated circuit device of claim 7, wherein said thermoplastic heating step is performed during wire bond.

10. The semiconductor integrated circuit device of claim 7, wherein said carrier material is plastic.

11. The semiconductor integrated circuit device of claim 7, wherein said carrier material is polyimide.

12. A semiconductor integrated circuit device in which a semiconductor die is mounted to a lead frame having no die paddle, manufactured by the steps of:
   a) applying a thermoplastic to a first side of a carrier material, said thermoplastic having a physical property such that as it is heated to about 100° C. it softens and flows, and as it cools to its preheated temperature it returns to its preheated state;
   b) heating said thermoplastic to its soft state;
   c) contacting said first side of said carrier material to leads of the lead frame;
   d) placing said semiconductor die on said first side of said carrier material;
   e) cooling said thermoplastic to its preheated state, thereby bonding said die and said leads of the lead frame to said carrier material, said carrier material supporting said die and said leads.

13. The semiconductor integrated circuit device of claim 2, wherein said heating step is performed after said contacting step and said placing step.

14. The semiconductor integrated circuit device of claim 12, wherein said carrier material is plastic.

15. The semiconductor integrated circuit device of claim 12, wherein said carrier material is polyimide.

* * * * *

UNITED STATES PATENT AND TRADEMARK OFFICE
CERTIFICATE OF CORRECTION

PATENT NO. : 5,140,404
DATED : August 18, 1992
INVENTOR(S) : Fogal et al.

It is certified that error appears in the above—identified patent and that said Letters Patent is hereby corrected as shown below:

Column 4, line 4, before "the", please insert -- As --.

Signed and Sealed this

First Day of February, 1994

Attest:

BRUCE LEHMAN

*Attesting Officer*     Commissioner of Patents and Trademarks